March 27, 1962 C. C. RAYBURN 3,027,494

MOUNTING MEANS FOR ELECTRICAL COMPONENTS

Filed Dec. 16, 1960 2 Sheets-Sheet 1

INVENTOR.
Charles C. Rayburn
BY
Robert S. Silver
Att'y.

March 27, 1962 C. C. RAYBURN 3,027,494

MOUNTING MEANS FOR ELECTRICAL COMPONENTS

Filed Dec. 16, 1960 2 Sheets-Sheet 2

INVENTOR.
Charles C. Rayburn
BY Robert D. Silver
ATTY.

United States Patent Office 3,027,494
Patented Mar. 27, 1962

3,027,494
MOUNTING MEANS FOR ELECTRICAL COMPONENTS

Charles C. Rayburn, Alexandria, Va., assignor to Illinois Tool Works, Chicago, Ill., a corporation of Illinois
Filed Dec. 16, 1960, Ser. No. 76,211
2 Claims. (Cl. 317—101)

This invention relates in general to mounting means for electrical components and more particularly relates to an insulating mounting to accomplish mounting of "module" sub-assemblies and other such components on a chassis.

To illustrate the invention, I have selected electrical components known as modules which are devices of the type described in U.S. Patent 2,821,617. Module sub-assemblies of that type include a number of components such as resistors, capacitors, diodes, etc. which are pre-assembled as a module so as to form a one component sub-assembly which is much desired to simplify and consolidate handling of electronic components in modern radios, TV's and other such instruments. Originally these sub-assemblies were designed to be associated with printed circuit boards, and such module sub-assemblies have found good commercial acceptance and use while the instant invention has utility with printed circuit boards and with boards or chassis of dielectric materials, it provides particular advantages to a metal chassis. There are certain disabilities, at times, with printed circuit panel boards, and in certain applications it has been found that a metal chassis gives better functional and economic results. For example, a metal chassis often proves superior in electro-magnetic shielding and circuit isolation in addition to being superior to printed boards or dielectric boards in conducting, convecting, radiating and dissipating heat from the heat generated by the electronic components.

Heretofore, the mounting of the module sub-assemblies to a metal chassis has posed many problems. For example, the riser wires that extend from the marginal edges of the wafers which make up the module package may be mounted on the metal chassis in such a manner that the riser wires are pulled at right angles to the axis of the riser wires and thus to the line of the solder joints along the edges of the modules. Since the assembly workers on the production line often use pliers for twisting riser wires either around various binding posts or in making connections with wires from other components, and apply mechanical forces which exceed the bond strength of the solder connection of the riser wire to the module, they often cause a disconnection of the riser wire which in turn breaks continuity in the circuit. Further, the module may short against the metal chassis making it necessary that extra insulation be added to the chassis or additional insulation be added to the coated module to prevent shorting. Further, radio spaghetti must often be used as an insulating sleeving over those riser wires which must cross other riser wires.

Also, heretofore, there has been no good way of referencing the module sub-assemblies in the identical position in each chassis in which they are mounted. Slight positionment variation may produce variations in electrical stray which somewhat negate the inherit uniformity of the module unit available if properly mounted. Further, in this regard, it has been difficult for servicemen of electronic apparatus to replace a module and seat it in the same position as it initially was mounted by the manufacturer.

It is the general object of this invention to provide an insulating grommet-like mounting member which obviates the disabilities enumerated hereinbefore.

It is a further object of this invention to provide a mounting grommet member for association with a module sub-assembly having long riser wires and a chassis which provides easy installation thereof, reduces the overall heighth of the total assembly, which is well adapted to be keyed so as to provide repetitive assembly techniques, is low in cost, and is otherwise well adapted for the purposes for which it was designed.

While the particular structural features of specific embodiments shown in the drawings are important, it is to be understood that the precise features shown and described may be varied within the broader aspects of the invention. To acquaint those skilled in the art with forms of construction of the invention and mounting techniques used, the invention will now be described in connection with the accompanying drawings, in which.

Figure 1:
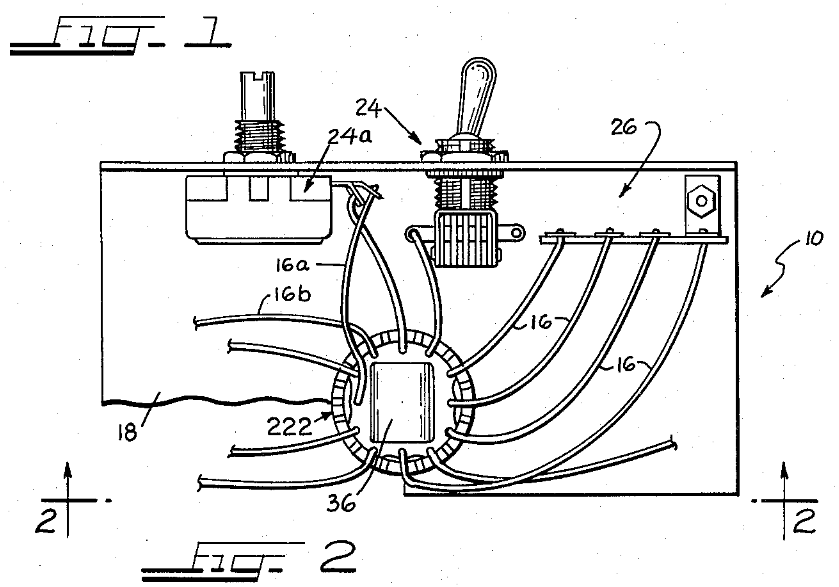
FIG. 1 is a plan view of a metal electronic chassis having assembled thereon a module sub-assembly by use of an insulating grommet-like member of a form within the purview of my invention.
Figure 2:
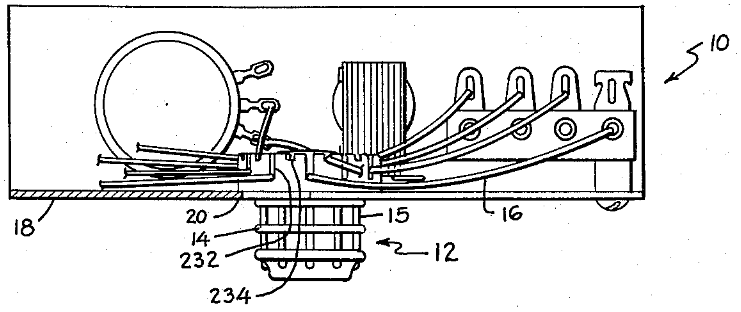
FIG. 2 is a side view partially in section along lines 2—2 showing the assembly of FIG. 1.

FIGS. 1 and 2 of the drawings discloses an electrical assembly 10 which includes a form of module sub-assembly 12 having a main body portion 14 and a plurality of extra long riser wires 15 providing lead wires 16. The riser wires 15 extend up along the side edges of the main body portion 14 to interconnect a plurality of wafers, and usually are soldered to each wafer and thus form the main body portion of the module. The lead wires 16 are the free ends of riser wires 15 and are used to electrically join the module with other circuit components such as 24, 24*a* and 26 integrated into the electric circuitry of a final product 10. This module sub-assembly 12 is shown mounted on the metal chassis 18. The novel annular insulating means or grommet-like members 22, 222, 322, 422, 522, and 622, which accomplish this mounting shall now be described, in actual application.

Figure 3:
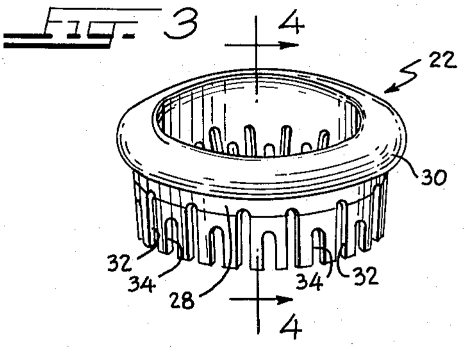
FIG. 3 is a isometric perspective view of one form of mounting member.
Figure 4:
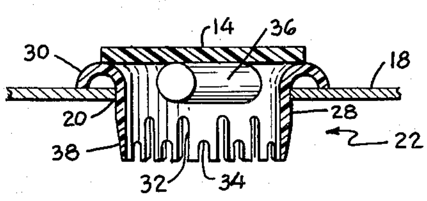
FIG. 4 is a semidiagrammatic sectional view somewhat along the lines 4—4 of FIG. 3 showing a grommet member in conjunction with a wafer and with a panel workpiece, the section through the wafer being along the diagonal thereof.

The insulating grommet-like members such as 22 comprising the instant invention may take a variety of forms. The essential function of the grommet-like member 22, independent of its exact form, is to electrically insulate the riser lead wires 16 from the metal chassis 18 particularly in the area adjacent to the aperture 20; to prevent mechanical stress from breaking the solder connections in the module sub-assembly; to provide an area for mounting a bulky component on a wafer, such as a diode or capacitor, without increasing the overall height of the module sub-assembly; to provide for spaced crossover of riser wires without use of spaghetti; and in some forms, to provide insulation between the bottom-most wafer and the metal chassis 18. As shown in FIGURE 3, the insulating grommet-like member 22 is formed with a somewhat hollow elongated shank portion 28 and has panel engaging means adjacent one end thereof which is denominated by the general reference number 30. The shank portion 28 may be tapered at 38 as shown in FIG. 4. On the end remote from the panel engaging means 30, the wall of the shank is notched so that the end surface has a plurality of notches 32 and 34 of varying axial extent. While I have elected to show the notches symmetrically and alternately arranged in a deep and shallow manner, it is to be realized that this is to be considered only illustrative. It is desirable that axially extending notches, such as the deep notches 32 and the relatively shallower notches 34, be placed in the periphery of the mounting member such that the relative heights can be used to effectuate a good physical crossover of the wires as well as to provide an insulating physical spacing thereof in such a crossover.

As is shown in FIGURE 4, the bottom-most wafer of the main body portion 14 of a module sub-assembly is adapted to have the corner areas thereof rest upon the upper or top marginal side of the grommet-like member 22 located at the end remote from the notched portion. It is necessary that the lead wires 16 fit within the various grommets shown without stressing thereof, and in a manner so that the bottom-most wafer locates against some referencing or abutting portion so as to mount same. As can be best seen in FIGURE 1, the internal diameter of all of the annularly arranged members, such as illustrated relative to member 222, is greater than the diameter of an imaginary figure in space which is transverse to the long axis of the main body portion 14 and to the axis of the wires 15 and which encompasses all of the riser wires, but is smaller than the diagonal dimension of the wafer. Thus, all of the riser wires 16 fit within the confines of the grommet-like member without any stress thereon and the upper edge portion of the grommet serves to either mount the module body or fit within the work panel aperture, and in either event serves to insulate the riser lead wires 16 from the metal chassis. Thus, in FIGURE 4, the section through a wafer is through the diagonal dimension thereof.

The riser wires 16 extend through the hollow shank portion and then are angularly bent to pass through the notches about the peripheral edge of the grommet elements. The application of any mechanical stress on the riser wires when thus handled is prevented relative to the solder joints where they adjoin the module sub-assembly. Further, the variation in height of the various notches affords relatively easy physical crossover of any of the wires 16. To illustrate, note in FIGURE 1 the crossover of wires **16*a* and 16*b***.

As is illustrated in FIGURE 1, and semi-diagrammatically illustrated in FIGURE 4, the annular opening of the grommet-like member permits the mounting of a rather large circuit component 36, such as a rolled capacitor, diode, or the like, on the bottom wafer of the module which permits reduction of the overall height of the module assembly relative to the chassis on which it is mounted. This helps to reduce the height of the center of gravity of the component in mounted position relative to the plane of the chassis on which it is mounted, which gives better vibrational resistance to the total assembly.

The various other forms of annular grommet-like members 22 shown in FIGURES 5–11 are identified with similar numerals but with a different prefix number. For example, in FIGURES 5 and 6, similar parts are shown with similar reference numerals to FIGURES 3–4 but with the addition of the prefix No. 2 making the entire assembly having the reference numeral 222; whereas FIGURE 7 has the entire sub-assembly denominated 322 and so on.

Figures 5, 7:
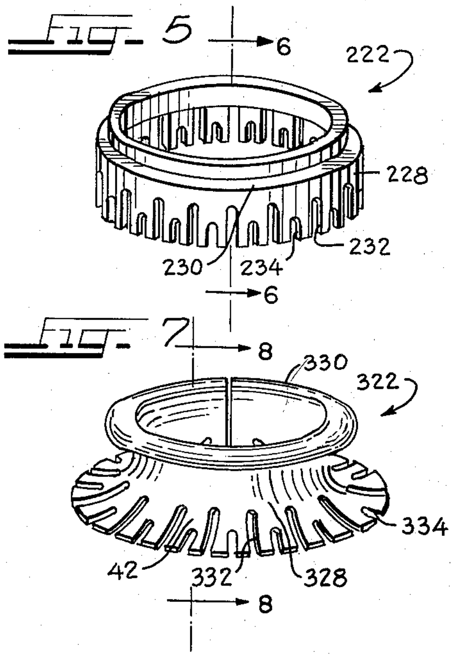
FIG. 5 is a view similar to FIG. 3 showing another form of construction of the grommet-like member and is the form used in the assembly shown in FIG. 1.
FIG. 7 is a perspective view similar to FIGS. 3 and 5 showing another form of construction of the grommet-like member.
Figure 6:
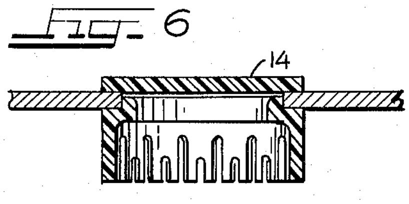
FIG. 6 is a sectional view similar to FIG. 4 of the grommet member taken along the line 6—6 in FIG. 5, a wafer being shown with the section line through the diagonal thereof.
Figure 8:
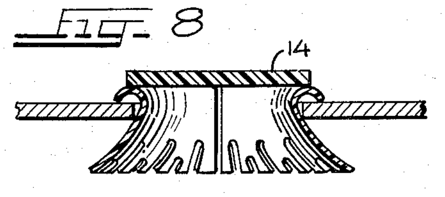
FIG. 8 is a sectional view similar to FIGS. 4 and 6 of a wafer and a mounting grommet-like member taken along the section line 8—8 shown in FIG. 7.

In FIGURE 5, the annular grommet-like member has a panel engaging shoulder portion 230 which has a radially reduced upwardly extending neck portion adapted to extend into the aperture of a complementary panel. The axial extent of the neck portion may be less than the thickness of the panel, or may be long enough (as shown in other embodiments) so that it extends up and engages the bottom of a wafer. The grommet-like members shown in FIGURE 1 and FIGURES 5 and 6 are held in place in the panel aperture by the compressive force between the main body portion 14 engaging the panel and the lead wires 16 after they are bent through the notches.

The annular member 322 shown in FIGURE 7 may be made of either flexible material or may be made in sheet form in a manner to be split coextensive its length. The upper portion of the annular member 322 overlies the upper surface of the panel to provide a panel engaging portion which also serves to insulate the main body portion 14 of the module sub-assemblies from the steel chassis. The bottom portion of the shank is flared at 42 to provide a more gradual transition of the wire 16 when it is placed in the notches 332 and 334.

Figure 9:
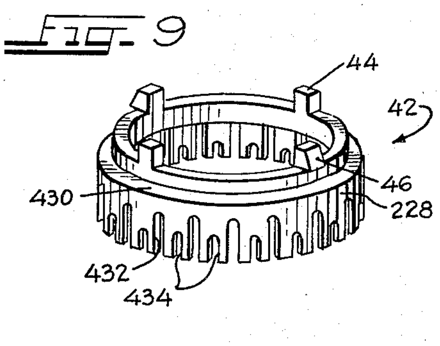
FIG. 9 is a perspective view similar to FIGS. 3, 5 and 7 showing an alternate construction of the grommet-like member.
Figure 10:
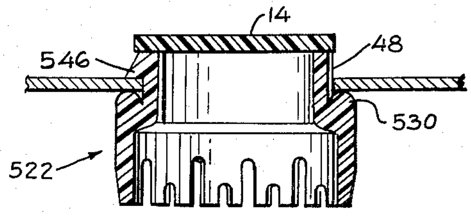
FIG. 10 is a view similar to FIGS. 4, 6 and 8 showing still another form of grommet-like member and wafer.

Still another form of insulating grommet-like member 422 is shown in FIGURE 9 and may have an axially extending lug portion 46 which is adapted to snap over the panel aperture margin, to fixedly mount the grommet in place on the panel. Two tabs may be fixed with snap over portions as shown or any of the plurality of extending portions such as 44 may be formed with a portion to overlie the panel to retain the grommet. It is also possible to use the upstanding portions 44 and 46 to orient the module sub-assembly 14 on the grommet if desired. The grommet-like member 522 in FIGURE 10 is similar to that shown in FIG. 9 except that the snap in portions 546 do not extend above the end surface thereof. The snap in portions 546 maintain the panel engaging shoulder 530 against the panel.

Figure 11:
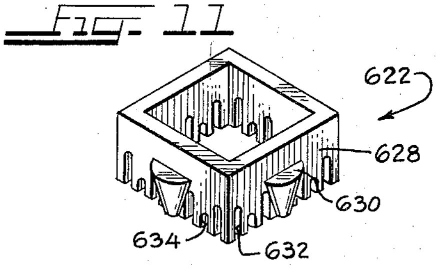
FIG. 11 is a perspective view of still another form of grommet-like member construction.

A still further form of insulating grommet member is shown in FIG. 11 and identified by the reference numeral 622. In essence the grommet is essentially square in configuration having panel engaging means 630 spacedly formed on the periphery thereof which engage the underside of the panel.

It will be obvious that it is very simple to orient any or all of the insulating members 22, 222, 322 etc. relative to the module sub-assembly by suitable depressions or lugs and further it is very easy to provide orientation of all of the grommet-like members relative to the chassis by ribs and the like such as rib 48 shown in FIGURE 10, as suitable and desired.

Although various embodiments of the invention have been shown and described, it is with full awareness that many further modifications thereof are possible. The invention therefore, is not to be restricted except in so far as is necessitated by the prior art and by the appended claims.

What is claimed by the invention is:

1. An electrical assembly comprising a module sub-assembly having a main body portion and a plurality of elongated spaced substantially parallel lead wires mechanically and electrically engaged with said main body portion and extending from one end thereof, a metal chassis member having an aperture therein larger in circumferential extent than an imaginary figure in space connecting the lead wires together transversely to the parallel axis thereof, and an apertured annular member of insulating material having a circumferential aperture dimension larger than the circumferential dimension of said imaginary figure, said annular member being disposed in said aperture of said chassis member, said annular member having an axial extent substantially greater than the axial extent of said aperture in said chassis member, said annular member being formed with a plurality of peripheral notches of varying height in an end thereof remote from said chassis member, said module sub-assembly main body portion being mounted in said annular member to said chassis member on the side remote from the notches in said annular member with said lead wires extending therethrough for cooperation with said notches.

2. An electrical assembly comprising a module sub-assembly having a main body portion and a plurality of elongated spaced substantially parallel lead wires mechanically and electrically engaged with said main body portion and extending from one end thereof, a metal chassis member having an aperture therein larger in circumferential extent than an imaginary figure in space connecting the lead wires together transversely to the parallel axis thereof, and an apertured annular member of insulating material having a dimension as measured circumferentially around the aperture in said annular member larger than the circumferential dimension of said imaginary figure, said annular member being disposed in said aperture of said chassis member, said annular member having an axial extent substantially greater than the axial extent of said aperture in said chassis member, said annular member being formed with a plurality of peripheral notches of varying height in an end thereof remote from said chassis member, said module sub-assembly main body portion being mounted in said annular member and said chassis member on the side remote from the notches in said annular member with said lead wires extending therethrough for cooperation with said notches, said lead wires being angularly bent to extend through said notches adjacent thereto without stressing the point of attachment of the lead wires to the main body portion, the varying height of said notches affording a spaced crossing of lead wires without electrical engagement thereof.

References Cited in the file of this patent

UNITED STATES PATENTS

| | | |
|---|---|---|
| 2,225,472 | Franklin | Dec. 17, 1940 |
| 2,559,759 | De Swart | July 10, 1951 |
| 2,664,458 | Rapata | Dec. 29, 1953 |
| 2,904,617 | King | Sept. 15, 1959 |

FOREIGN PATENTS

| | | |
|---|---|---|
| 122,781 | Sweden | Sept. 21, 1948 |
| 842,668 | Germany | June 30, 1952 |